(12) United States Patent
Chudzik et al.

(10) Patent No.: US 6,451,662 B1
(45) Date of Patent: Sep. 17, 2002

(54) METHOD OF FORMING LOW-LEAKAGE ON-CHIP CAPACITOR

(75) Inventors: Michael Chudzik, Beacon, NY (US); Oleg Gluschenkov, Wappingers Falls, NY (US); Raj Jammy, Wappinger Falls, NY (US); Uwe Schroeder, Dresden (GB); Helmut Tews, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/970,635

(22) Filed: Oct. 4, 2001

(51) Int. Cl.[7] ............................................... H01L 21/20
(52) U.S. Cl. ..................... 438/386; 438/240; 438/393; 438/775
(58) Field of Search ................................ 438/386, 393, 438/240, 790–793, 775, 396, 776, 785, 788, 770, 762, 398, 694, 773, 151; 257/306

(56) References Cited

U.S. PATENT DOCUMENTS

| 4,949,154 | A | | 8/1990 | Haken |
| 5,434,109 | A | | 7/1995 | Geissler et al. |
| 5,624,865 | A | | 4/1997 | Schuegraf et al. |
| 5,966,595 | A | * | 10/1999 | Thakur et al. ............... 438/151 |
| 6,014,310 | A | | 1/2000 | Bronner et al. |
| 6,037,273 | A | | 3/2000 | Gronet et al. |
| 6,140,024 | A | | 10/2000 | Misium et al. |
| 6,194,755 | B1 | | 2/2001 | Gambino et al. |
| 2001/0011740 | A1 | * | 8/2001 | Deboer et al. ............... 257/306 |

FOREIGN PATENT DOCUMENTS

| JP | 11145425 A | 5/1999 |
| JP | 11195758 A | 7/1999 |

* cited by examiner

*Primary Examiner*—Olik Chaudhuri
*Assistant Examiner*—Yennhu B. Huynh
(74) *Attorney, Agent, or Firm*—Steven Capella

(57) ABSTRACT

An improved capacitor is formed by a process where an improved node dielectric layer is formed with an improved dielectric constant by performing an Free Radical Enhanced Rapid Thermal Oxidation (FRE RTO) step during formation of the node dielectric layer. Use of an FRE RTO step instead of the conventional furnace oxidation step produces a cleaner oxide with a higher dielectric constant and higher capacitance. Other specific embodiments of the invention include improved node dielectric layer by one or more additional nitridation steps, done by either Remote Plasma Nitridation (RPN), Rapid Thermal Nitridation (RTN), Decoupled Plasma Nitridation (DPN) or other nitridation method; selective oxidation; use of a metal layer rather than a SiN layer as the dielectric base; and selective oxidation of the metal layer.

3 Claims, 4 Drawing Sheets

METHOD OF FORMING LOW-LEAKAGE ON-CHIP CAPACITOR

BACKGROUND OF THE INVENTION

1. Technical Field

This invention generally relates to fabrication of integrated circuit capacitors, and more specifically relates to fabrication of on-chip capacitors.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced without loss of device performance.

The push for ever increasing device densities is particularly strong in Dynamic Random Access Memory (DRAM) markets. One particular area of concern in DRAM design is the storage capacitor used to store each memory cell. The density of DRAM designs is to a great extent limited to by the feature size of the storage capacitor.

A charge stored in a storage capacitor is subject to current leakage and, therefore, DRAM must be refreshed periodically. The time allowed between refresh without excess charge leakage is the "data retention time", which is determined by the amount of charge stored at the beginning of the storage cycle and the amount of leakage current through different kinds of leakage mechanisms. Many efforts are expended to minimize the leakage mechanisms so as to extend the time allowed between refresh cycles.

Several methods have been used to facilitate the shrinkage of the capacitor feature size while maintaining sufficient capacitance. For example, stacked capacitors have been located above the transfer devices. Unfortunately, this approach presents difficulties with topography and with connecting the capacitors.

Another approach has been the use of trench capacitors as storage capacitors. Trench capacitors extend the storage node into the substrate to increase the capacitance without increasing the area used on the substrate. The trench capacitor design conventionally uses a highly conductive single crystal silicon substrate as the counter electrode, and a highly conductive polycrystalline silicon in a deep trench as the storage electrode of the capacitor. By extending the capacitor in the vertical dimension, trench capacitors allow the capacitor feature size to be decreased without decreasing the resulting capacitance. Capacitance for a trench capacitor is described by the following equation:

$$C = K \times \frac{A_{trench}}{T_{film}}$$

Where C is capacitance, K is the dielectric constant of the node dielectric layer, $A_{trench}$ the sidewall area of the trench, and $T_{film}$ is the thickness of the node dielectric film. As described by the previous equation, the capacitance of a trench capacitor is linearly dependent upon the sidewall area of the trench and the dielectric constant of the node dielectric layer, and inversely dependent upon the thickness of the dielectric film.

Traditionally, as the trench area decreases, the capacitance has been maintained by decreasing the thickness of the dielectric film. However, a fundamental thickness limit is being approached due to the leakage currents through the dielectric film as it is being thinned. The leakage currents across the n ode dielectric must be low enough that the stored charge, which delineates either a "1" or a "0" bit state, remains long enough to be detected at a later time. The tunneling currents are exponentially dependent upon the thickness of the node dielectric layer and the barrier height between the electrode material and the node dielectric layer. Thinning the node dielectric layer causes an exponential increase in leakage current, placing a limit on how much the node dielectric can be thinned. Therefore, the capacitor performance is defined as a capacitance at a specified leakage or a leakage current at a specified capacitance. The higher the capacitance at a specified leakage current, the higher is the performance of the capacitor. Similarly, the lower the leakage current at a specified capacitance, the higher is the performance of the capacitor.

Metal-Insulator-Semiconductor (MIS) structures are often employed in advanced field effect transistors (FET). They have also been optimized in the capacitance and leakage space. The art of making short-channel FETs teaches that the insulator layer in an MIS structure should be ultra thin (less than 20 Å for the current generation of high performance MOSFETs) in order to suppress short-channel effects and increase the performance of the transistor.

It is customary to measure the thickness of a gate insulator in terms of an equivalent silicon oxide thickness (EOT). The FOT of the dielectric is simply a measure of its capacitance per unit area. When silicon oxide is used as the dielectric of a capacitor, its EOT is close to its physical thickness. Accordingly, from the stand point of advanced MIS FET transistors, it is desirable to have a gate insulator with an EOT of below 20 Å. A fundamental parameter that limits the physical thickness of a gate insulator and, consequently, its EOT, is the leakage current through a thin dielectric. High-performance FETs in logic circuits require a gate leakage current of less than 1–10 A/cm$^2$. Accordingly, gate insulators are selected, in-part, on the basis of their EOT and a leakage current of less than 1–10 A/cm$^2$. A quality factor for a gate insulator includes long-term reliability parameters, interface trap density, and fixed mobile charge.

Contrarily, high-performance capacitors have an entirely different set of parameters even though some of them are MIS structures. For a typical DRAM capacitor, the leakage current should be below 10$^{-7}$ A/cm$^2$ in order to retain the stored charge for several milliseconds. In addition, capacitors are not sensitive to the interface charge density. This allows for the use of a wide variety of dielectric materials in a capacitor which are not suitable for gate insulators due to the density of interfacial traps. Accordingly, the present disclosure relating to on-chip capacitors is different from the art of thin gate insulators due to the different requirement on the allowed leakage current: $I_{leakages} < 10^{-4}$ A/cm$^2$.

Thus, there is a continuous need for improved memory capacitor designs and improved methods of on-chip capacitor fabrication to maintain capacitance values despite continued reductions in capacitor area and minimum node dielectric layer thickness limits.

SUMMARY OF THE INVENTION

The present invention provides an improved node dielectric layer for an on-chip capacitor and method of fabricating the layer which increases its performance. In particular, the present invention includes a Free Radical Enhanced Rapid Thermal Oxidation (FRE RTO) step while forming the node dielectric layer of an on-chip capacitor instead of a furnace oxidation step to produce a cleaner oxide than the furnace oxide. The cleaner oxide formed by the FRE RTO step results in a higher energy barrier between the electrodes and the node dielectric layer which results in lower leakage and higher performance. Other specific embodiments of the invention include: a Low Pressure Chemical Vapor Deposition (LPCVD) of SiN step; a nitridation step, done by either Remote Plasma Nitridation (RPN), Rapid Thermal Nitridation (RTN), Decoupled Plasma Nitridation (DPN) or other nitridation method; selective oxidation; deposition of a metal layer; and selective oxidation of the metal layer. Combinations of these various process steps of forming a node dielectric layer improve the layer quality and, thus, the performance of the node dielectric layer. The improved dielectric layer, therefore, increases the capacitance of the on-chip capacitor without a substantial increase in the leakage current. Alternatively, the improved dielectric layer decreases the leakage without a decrease in the capacitance.

The foregoing and other features and advantages of the present invention will be apparent from the following more particular description of embodiments of the invention, as illustrated in the accompanying drawings.

DETAILED DESCRIPTION OF THE INVENTION

As discussed above, embodiments of the present invention described herein relate to on-chip capacitors, and the use of an improved node dielectric layer having an increased performance. It will be clear to those of ordinary skill in the art, however, that the methods described herein also apply to other on-chip capacitors such as, for example, stacked capacitors and capacitors used in radio frequency (RF) circuits.

Figure 1:
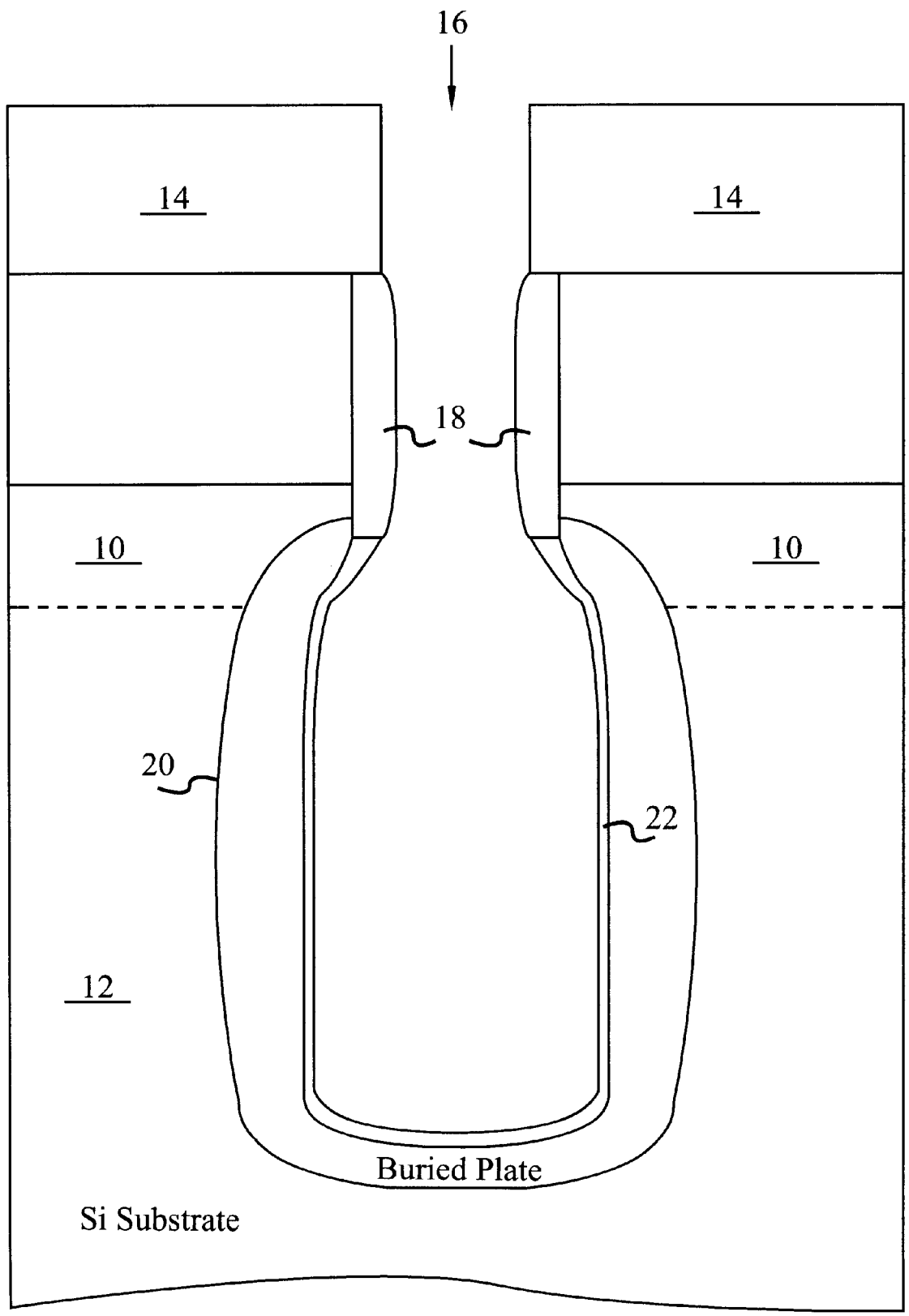
FIGS. 1 and 2 are cross-sectional views of a deep trench capacitor at various stages of the fabrication process, the deep trench capacitor having a node dielectric layer configured according to an embodiment of the present invention.

Although the present invention may be readily adapted to a variety of methods of fabricating an on-chip capacitor, with reference to FIG. 1, the following is one example of a method of fabrication. It should be understood that the invention is not limited to the specific structures illustrated in the drawings or to the specific steps detailed herein. While the drawings illustrate a bottle-shaped trench, the invention may be practiced using capacitors of other shapes and employing alternative void-forming techniques. It should also be understood that the invention is not limited to use of type of electrode material (e.g., doped semiconductor, metal, etc.) and any specific do pant type provided that the do pant types selected for the various components are consistent with the intended electrical operation of the device.

FIG. 1 is a diagram of a bottle-shaped deep trench capacitor at a stage during the fabrication of the trench capacitor according to the embodiments of the present invention. As will be clear to one of ordinary skill in the art from the disclosure herein, the present invention may be used to improve the node dielectric layer of capacitors in conjunction with a variety of fabrication processes. In the embodiments discussed, the methods of the present invention begin with traditional capacitor formation techniques. The embodiments of the methods described herein each begin with forming a lightly doped region 10 in a semiconductor substrate 12. Semiconductor substrate 12 may be formed from any conventional semiconducting material, including, but not limited to: Si, Ge, GaP, InAs, InP, SiGe, GaAs, or other III/V compounds. For the exemplary purposes of this disclosure, the semiconductor substrate 12 of the following examples is a silicon substrate 12.

The pad dielectric layer 14 (which typically includes a silicon nitride layer) may be formed on the silicon substrate 12. A trench pattern 16 with a narrow upper regions may be etched into the pad dielectric layers 16, and deep trenches with broad lower regions may be etched into the silicon substrate 12. The methods described here are not limited, however, to bottle-shaped capacitor structures. An oxide collar 18 may be formed in the narrow upper region of the trench by local oxidation of silicon (LOCOS) or one of the many available techniques. At the broad lower region of the trench, a buried plate 20 may be formed as an out-diffusion from the trench 16, with the oxide collar 18 serving as a mask. These steps may be accomplished using any of the available techniques. In some instances, it may also be desirable to form a thin oxide layer (not shown) between semiconductor substrate 12 and pad dielectric 14.

The initial bottle-shaped structure shown in FIG. 1 may be fabricated using conventional techniques that are well known to those of ordinary skill in the art. For example, the bottle-shaped structure may be fabricated using the processes disclosed in U.S. Pat. Nos. 4,649,625 to Lu, U.S. Pat. No. 5,658,816 to Rajeevakumar, U.S. Pat. No. 5,692,281 to Rajeevakumar, and U.S. Pat. No. 6,194,755 B1 to Gambino et al., the disclosures of which are hereby incorporated herein by reference. The buried plate may be formed by any conventional technique of diffusing the appropriate conductivity type do pant through the trench wall. See, for example, the technique disclosed in U.S. Pat. No. 5,395,786 to Hsu et al, the disclosure of which is hereby incorporated herein by reference.

A node dielectric layer 22 may be formed over the buried plate 20 in the trench. In a conventional process, a node dielectric layer is formed according to the following process: First, exposing the trench to ammonia gas to nitride the Si sidewalls of the trench; Second, performing a LPCVD of SiN to create a stoichiometric, high quality SiN layer (dielectric constant of approximately 7.5) over the nitrided sidewalls; and Third, performing a wet oxide process in a furnace which exposes the wafer to water vapor at a high temperature to re-oxidize the top layer of SiN. The third step, which re-oxidizes the top layer of SiN in a furnace, converts approximately 18–20 Å of SiN to $SiO_2$ of medium quality. The $SiO_2$ layer acts as an leakage barrier to reduce leakage of tunneling electrons. The $SiO_2$, however, reduces the effectiveness of the overall dielectric because it has a lower dielectric constant.

In accordance with a first embodiment of the present invention, the node dielectric layer is formed on a semiconductor surface by nitriding the Si sidewall of the trench by exposure to ammonia gas (e.g. $NH_3$ bake at 800–1100 C for 10–30 min, or particularly 950 C for 10–30 min) or other method known in the art. Next, the nitrided Si sidewall is oxidized by FRE RTO to convert a portion of the SiN in the sidewall to $SiO_2$. FRE RTO may be performed by flowing $O_2$ and $H_2$ into a single wafer tool which is operating at elevated temperatures (e.g. 900–1100 C, or particularly 1050 C). The $O_2$ and $H_2$ react in the volume of gas and on the hot wafer to create $H_2O$ and atomic oxygen used to oxidize the nitrided Si sidewall. Depending upon the desired thickness of the oxidized portion of the nitrided Si sidewall, reaction times may vary 2–300 sec and reaction temperatures may vary between 600–1200 C. This specific method of generating FRE RTO is also known in the art as in-situ steam generation (ISSG) technique. FRE oxidation may also be performed by flowing oxygen-containing molecules (e.g., $O_2$, $H_2$, $N_2O$, NO, $O_3$) through a form of highly energetic excitation (e.g., plasma, UV-light, etc.). Such excitation breaks the molecules yielding a non-zero concentration of atomic oxygen.

By generating the $SiO_2$ by FRE RTO rather than by wet oxide in a furnace, a higher quality film is generated. The quality of the film relates to the amount of leakage through the film, which is related to the bandgap of the film, which is related to stoichiometry. Lower leakage through the film is evidence of a higher purity film. According to particular embodiments of the invention, the leakage is below $10^{-8}$ Amps/cm$^2$. Use of FRE RTO allows creation of a thinner film without increased leakage, enabling higher device densities on a semiconductor substrate without reduced performance. While there is no specific requirement for the thicknesses of the SiN layer or the $SiO_2$ layer, for trench capacitors, a node dielectric layer is conventionally formed to between 30–60 Å thick, and in a particular embodiment of the invention between 36–40 Å thick. Thus, according to the first embodiment of the invention, a node dielectric layer may be formed by: 1) nitriding the Si sidewall; and 2) oxidizing the nitrided sidewall of the trench by FRE RTO.

According to a second embodiment of the present invention, in addition to the method of the first embodiment, SiN is deposited on the nitrided Si sidewall of the trench by LPCVD prior to the FRE RTO. Deposition of SiN on the trench sidewall improves the stoichiometry of the SiN layer and fills any gaps or pinholes in the nitrided Si sidewall of the trench. LPCVD of SiN on the nitrided sidewall creates a very stoichiometric, high quality SiN layer with a high dielectric constant. Thus, according to the second embodiment of the invention, a node dielectric layer may be formed by: 1) nitriding the Si sidewall; 2) depositing SiN on the sidewall by LPCVD; and 3) oxidizing the SiN on the sidewall of the trench by FRE RTO.

According to a third embodiment of the present invention, in addition to the method of the second embodiment, the sidewall of the trench may be nitrided after it is oxidized by FRE RTO. While the nitridation may be accomplished by any nitridation process known in the art, in a particular embodiment, the sidewall is nitrided by at least one of RPN, RTN and DPN. The RPN and DPN expose the trench to atomic nitrogen, a plasma process which breaks apart the N atoms and makes them very reactive. Conventionally RPN processes are performed at temperatures between 500–900 C, and in one embodiment at 550 C, for 30–240 seconds depending upon the desired thickness of the nitrided portion. DPN processes are conventionally performed at temperatures between 60–300 C, and in one embodiment around 100 C, for 30–240 seconds depending upon the desired thickness of the nitrided portion. One of ordinary skill in the art will readily be able to determine an appropriate temperature and duration for a desired thickness. The RTN process uses ammonia gas to nitride the oxidized layer. RTN processes are conventionally performed at elevated temperatures (850–1150 C) for between 5–60 seconds, though longer times are contemplated. Furthermore, although it is not limited to a single wafer tool, this process may be performed using a single wafer tool. The existence of $SiO_2$ is desirable to reduce electron tunneling. However, the $SiO_2$ reduces the total dielectric effectiveness of the node dielectric because of its lower dielectric constant. By nitriding the oxidized layer, the stoichiometry of the node dielectric layer and the dielectric constant of the layer are improved, thus improving node reliability.

Thus, according to the third embodiment, a node dielectric layer may be formed by: 1) nitriding the Si sidewall; 2) depositing SiN on the sidewall by LPCVD; 3) oxidizing the SiN on the sidewall of the trench by FRE RTO; and 4) nitriding the oxidized sidewall of the trench. Due to the effectiveness of the FRE RTO and sidewall nitriding toward improved capacitance and reduced leakage, the LPCVD of SiN on the sidewall may not be necessary. Eliminating the LPCVD of SiN also further reduces the thickness of the dielectric film. Accordingly, a particular embodiment of the invention forms a node nitride layer by: 1) nitriding the Si sidewall; 2) oxidizing the SiN on the sidewall of the trench by FRE RTO; and 3) nitriding the oxidized sidewall of the trench.

The fourth embodiment of the present invention is similar to the third embodiment of the invention, but the additional nitridation of the trench sidewall is performed prior to the FRE RTO of the trench sidewall. According to the fourth embodiment, after the sidewall is initially nitrided, such as by ammonia gas, and the SiN is deposited, such as by LPCVD, the sidewall is again nitrided prior to oxidizing the sidewall by FRE RTO. By performing an additional nitriding on the sidewall after the SiN deposition, the dielectric layer may be further densified with N to ensure a high quality layer with sufficient amounts of N. The further N densified dielectric layer maintains a higher dielectric constant, greater stoichiometry and fewer pinholes. As with the third embodiment, while the additional nitridation step may be accomplished by any nitridation process known in the art, in a particular embodiment, nitridation may be accomplished by at least one of RPN, RTN and DPN.

Thus, the node dielectric layer of the fourth embodiment may be formed by 1) nitriding the Si sidewall; 2) depositing SiN on the sidewall by LPCVD; 3) nitriding the oxidized sidewall of the trench; and 4) oxidizing the SiN on the sidewall of the trench by FRE RTO. Similar to the third embodiment, due to the effectiveness of the FRE RTO and nitriding of the oxidized layer steps at improving the capacitance of the trench capacitor and reducing the leakage, the LPCVD of SiN on the sidewall may not be necessary. Thus, the node dielectric layer may be alternatively formed by: 1) nitriding the Si sidewall; 2) nitriding the nitrided sidewall of the trench; and 3) oxidizing the SiN on the sidewall of the trench by FRE RTO.

The fifth embodiment of the invention differs from previous embodiments in that instead of nitriding the Si sidewall to create the base layer of the node dielectric, or optionally, in addition to nitriding the Si sidewall, a metal layer is deposited on the sidewall prior to the oxidation step. A metal layer may be deposited on the sidewall by chemical vapor deposition (CVD) or atomic layer deposition (ALD). The thickness of the layer depends on the desired thickness for the node. The thickness of a node in one embodiment is between 30–100 Å.

FRE RTO of the metal layer generates a high quality metal oxide layer. Use of a metal layer in the node dielectric increases the overall dielectric constant of the node dielectric layer. In selecting an appropriate metal for deposition, an embodiment of the invention selects a metal which, when oxidized, forms an oxide with a high dielectric constant. A high dielectric constant is considered to be a dielectric constant of 7 or higher, such as $Al_2O_3$ or any metal oxide that has a higher dielectric constant than $Si_3N_4$. In a particular embodiment of the invention, a metal is used which creates an oxide with a dielectric constant of up to 300 or higher, such as $TiO_2$ and $WO_3$. Some metal oxides crystallize at lower temperatures than dictated by the thermal budget of the DRAM fabrication process and hence suffer from grain boundary induced leakage currents, while maintaining high dielectric constants. By nitriding the Si sidewall prior to deposition of the metal layer, the leakage currents may be reduced by forming a thermally stable amorphous interface. By oxidizing the metal using an FRE RTO step, the oxidation of the metal is very controlled and uniform at relatively low temperatures. The resulting oxide layer-significantly reduces the overall leakage through the node dielectric layer.

Thus, according to this fifth embodiment, a node dielectric layer may be formed by: 1) optionally nitriding the Si sidewall; 2) depositing a metal layer on the sidewall; 3) oxidizing the metal layer by FRE RTO; and 4) optionally nitriding the oxidized sidewall of the trench. It should be clear to one of ordinary skill in the art that when oxidizing the metal layer by FRE RTO, the metal layer may be completely oxidized, or only partially oxidized. Using a process to partially oxidize only a top portion of the metal leaves a large supply of electrons or carriers present, even in a high electric field. Thus, there is an increase in capacitance due to the abundance of carriers, and therefore, a reduced or eliminated depletion layer, unlike ordinary doped Si.

Figure 2:
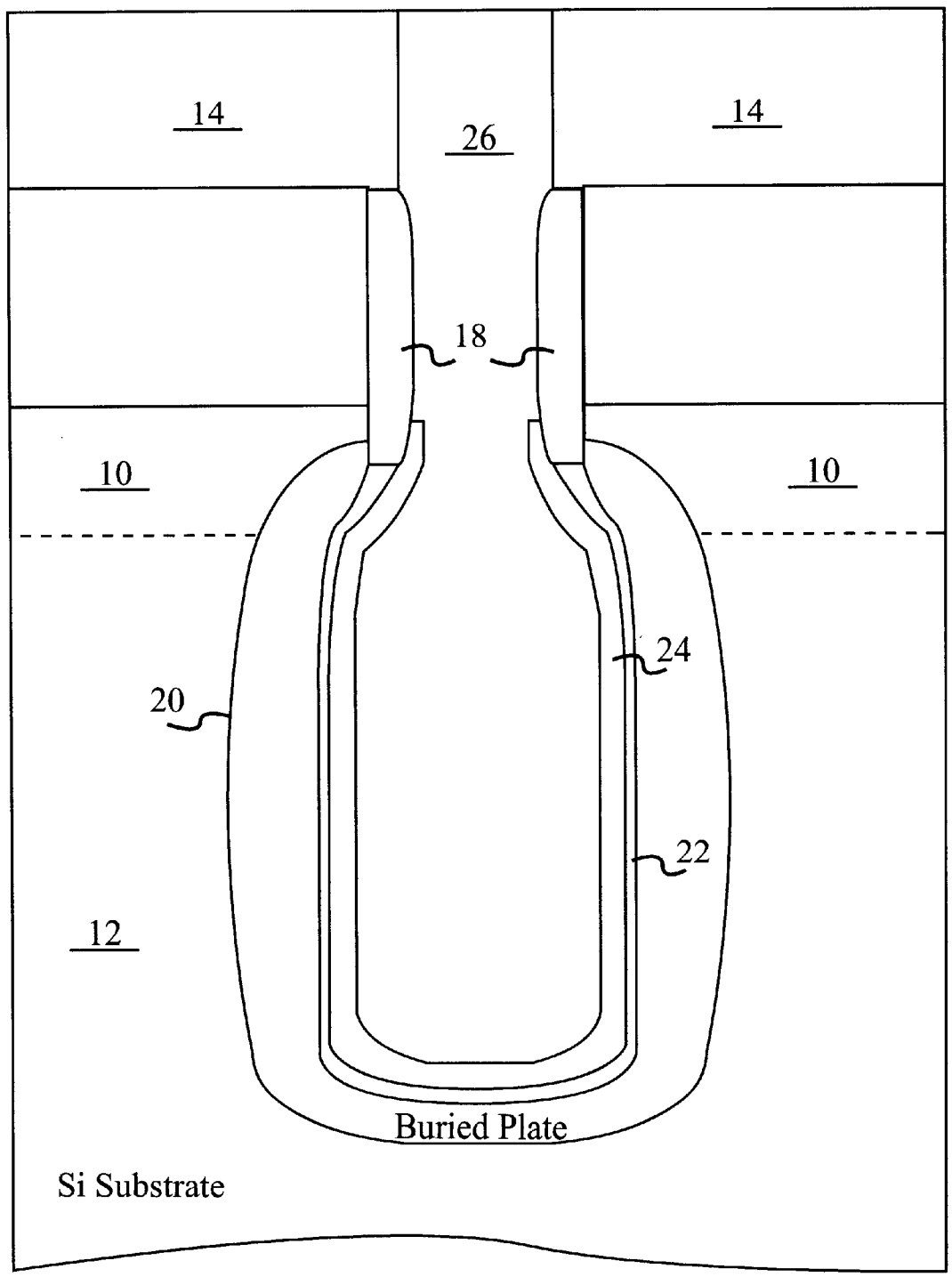

Referring now to FIG. 2, once the node dielectric layer 22 is formed according to an embodiment of the present invention, the remainder of the capacitor is formed according to conventional capacitor forming techniques such as those described in the patent discloses previously incorporated herein by reference. Conventionally, the trench 16 is layered with a polysilicon or doped polysilicon layer 24 in a suitable manner such as by LPCVD using $SiH_4$ and $AsH_3$ as reactants at a temperature that will not disturb the thermal budget (e.g., preferably between 500 and 600° C.).

Figure 3:
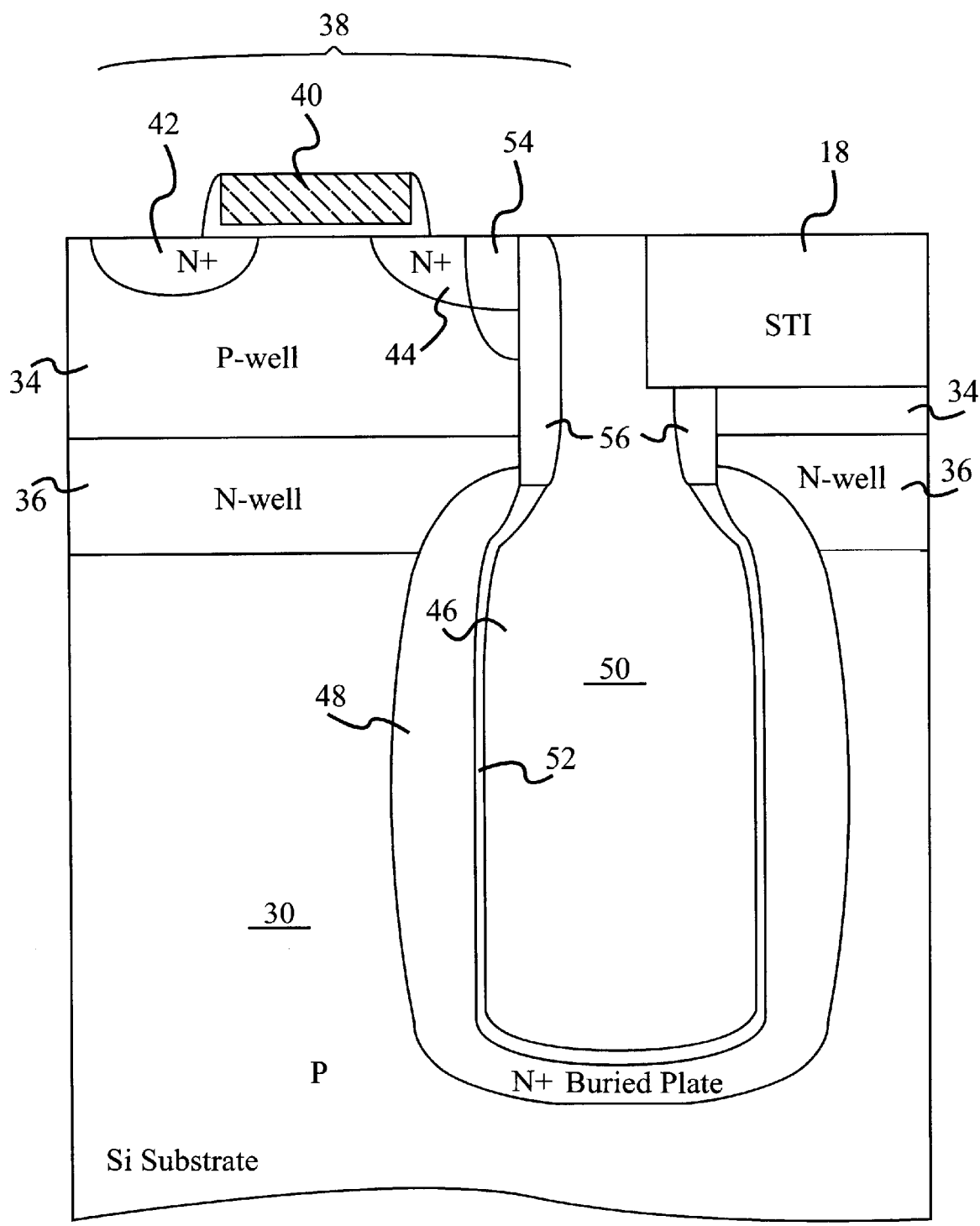
FIG. 3 illustrates a device with deep trench capacitor having a node dielectric layer configured according to an embodiment of the present invention.

The trench capacitor of the above described invention may be further refined by the use of a substrate plate trench design. Referring to FIG. 3, there is shown a schematic cross-sectional view of the basic buried plate trench DRAM cell 30. The cell includes a substrate 32 of P type semiconductor. A P-well 34 is formed above an N-well 36. At the upper surface of the P-well 34 a transfer device 38 is formed that includes a control gate 40 that is responsive to a word access line of the DRAM array support circuits (not shown). The transfer device 38 couples data between bit line diffused $N^+$region 42 and diffused $N^+$region 44 through the channel region formed in P-well 34. A deep trench 46 is formed into the substrate 30. Surrounding the deep trench 46 is formed a buried plate 48 that serves as the capacitor counter electrode, and is connected to the buried plates of other cells through N-well 36. Inside deep trench 46, a capacitor storage node may be formed comprising an $N^+$type polysilicon electrode 50 isolated from substrate 30 by a thin dielectric layer 52 formed according to an embodiment of the present invention. $N^+$region 44 and the polysilicon storage node 50 are connected by a buried strap 54. At the top of the storage trench 46 is a thick isolating collar 56 which serves to prevent vertical leakage. STI region 58 serves to isolate this cell 30 from others in the array.

Accordingly, it will be clear to those of ordinary skill in the art that the present invention provides a method of forming an improved capacitor. In one embodiment of the invention, the capacitor includes a thin silicon nitride-silicon oxide (NO) stack where the oxide layer is produced by thermal oxidation of the silicon nitride film with a low-temperature FRE RTO method. The oxidation conditions are tailored to improve the capacitor performance in the low leakage regime ($I_{leakage}<10^{-4}$ A/cm$^2$). The higher performance of the capacitor means a high value of capacitance (lower value of EOT) at the same leakage current. Alternatively, this results in a lower leakage value at the same EOT value.

Using this standard to evaluate the performance of capacitors having dielectric layers formed by a variety of methods, experiments were conducted on the leakage current versus the EOT value of several capacitors. The experiments were conducted to determine the performance of low-temperature FRE RTO-based NO capacitor as compared to a standard dry/wet-based NO capacitor. In the experiment, a square-shaped test microstructure was used having an area of $10^{-4}$ cm$^2$. The microstructure was isolated from other microstructures with a thick field oxide. A conductive silicon substrate served as the first electrode. The dielectric layer was formed on the silicon substrate. Subsequently, a conductive layer of either highly-doped polysilicon or metal was deposited over the entire substrate. An additional mask was used to pattern the upper layer of the metal. The test capacitor also had an area of $10^{-4}$ cm$^2$. Both capacitive vs. voltage (C-V) and current vs. voltage (I-V) parameters of the capacitor were measured. The C-V plot was used to extract the EOT data, and the I-V curve was used to define leakage. The leakage current was taken at −1V bias. The current measuring system had a limitation on the lowest value of the electrical current it can measure. The lower limit of the current measurement was $10^{-13}$ A. The results of the experiment are shown in FIG. 4.

Figure 4:
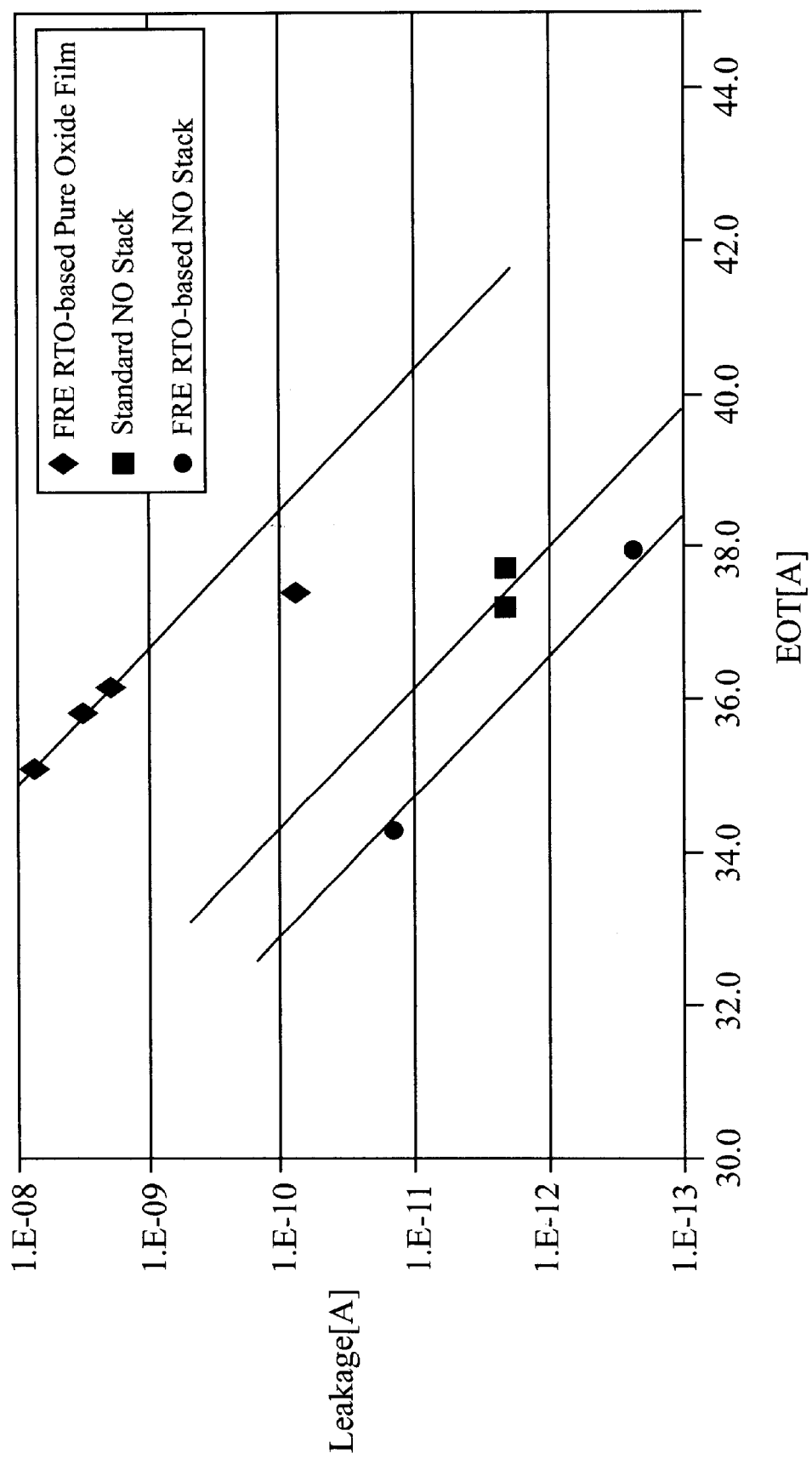
FIG. 4 is a graph diagram of leakage current versus equivalent oxide thickness showing trend lines for three capacitor types tested.

FIG. 4 compares the performance of various on-chip capacitors on a leakage vs. EOT graph. The closer to the lower left corner of the graph of FIG. 4 the capacitor marker is located, the higher the performance of the capacitor. The diamond-shaped markers and the associated trend line 70 represent the results for an FRE RTO-based silicon oxide capacitor. The square-shaped markers and the associated trend line 72 represent the results for a standard NO capacitor. The circle-shaped markers and the associated trend line 74 represent the results for an FRE RTO-based NO capacitor. Within each category of capacitors, the EOT was varied via increase of the silicon oxide thickness. The longer the oxidation time, the thicker the silicon oxide layer, the larger the value of EOT.

The FRE RTO-based silicon oxide was produced by completely oxidizing a thin layer of SiN and by oxidizing a Si substrate at temperatures between 900 C and 1100 C. The standard NO stack was produced by oxidizing a layer of thermal and LPCVD SiN in an oxidation furnace. The FRE RTO-based NO stack was produced by the FRE RTO of thermal and LPCVD SIN at a temperature of 900 C. The performance of the FRE RTO-based NO stack is better than that of the standard NO stack and the FRE RTO-based pure oxide film. Thus, the results confirm that the low-temperature FRE RTO oxidation method used in embodiments of the present invention produces a higher performance NO capacitor in the $I_{leakage}<10^{-4}$ A/cm$^2$ range.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. For example, it will be clear to those of ordinary skill in the art that the methods of forming a dielectric layer with low leakage described herein are readily applicable to a variety of on-chip structures and the invention is not limited to the trench capacitor embodiments shown and described herein.

What is claimed is:

1. A method of forming a dielectic for a capacitor, the method comprising:
   a. forming a nitride film on a first electrode surface by:
      (i) reacting said surface with a nitrogen source to form a first nitride, and
      (ii) depositing an additional nitride over said first nitride by chemical vapor deposition; and
   b. oxidizing at least a portion of the nitride film by free radical enhanced oxidation.

2. The method of claim 1, wherein the step of forming said nitride film comprises nitriding at least a portion of the additional nitride by at least one method selected from remote plasma nitridation rapid thermal nitridation and decoupled plasma nitridation.

3. The method of claim 1, further comprising nitriding at least a portion of the oxidized portion of the nitride film by at least one method selected from remote plasma nitridation, rapid thermal nitridation and decoupled plasma nitridation.

* * * * *